United States Patent
Sawko

(10) Patent No.: US 10,476,258 B2
(45) Date of Patent: Nov. 12, 2019

(54) METHOD OF OPERATING A PROTECTION DEVICE, ASSOCIATED COMPUTER PROGRAM PRODUCT, PROTECTION DEVICE AND ELECTRICAL INSTALLATION

(71) Applicant: Schneider Electric Industries SAS, Rueil-Malmaison (FR)

(72) Inventor: Piotr Sawko, Stafford (GB)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/184,013

(22) Filed: Jun. 16, 2016

(65) Prior Publication Data

US 2016/0372916 A1    Dec. 22, 2016

(30) Foreign Application Priority Data

Jun. 19, 2015    (EP) .................................... 15173020

(51) Int. Cl.
*H02H 7/09*     (2006.01)
*H02H 3/00*     (2006.01)
(Continued)

(52) U.S. Cl.
CPC .............. *H02H 7/09* (2013.01); *H02H 3/006* (2013.01); *H02H 3/083* (2013.01);
(Continued)

(58) Field of Classification Search
CPC .... F04D 25/166; F04D 27/0292; F04D 27/00; H02P 1/16; B60K 6/26; B60K 6/365;
(Continued)

(56) References Cited

U.S. PATENT DOCUMENTS 3,129,358 A * 4/1964 Harbaugh .............. H01H 75/04
                                                 335/28
3,205,420 A * 9/1965 Cobb ........................ H02P 1/58
                                                 307/57
(Continued)

FOREIGN PATENT DOCUMENTS

DE    10 2004 027 936 A1    12/2005
FR     2 663 473 A1    12/1991

OTHER PUBLICATIONS

European Search Report dated Jan. 18, 2016 in European Application 15173020, filed on Jun. 19, 2015.
"Overcurrent Protection/7SJ62", XP055241971, Siemens SIP, Edition 7, 2013, 38 pages.

*Primary Examiner* — Rina I Duda
(74) *Attorney, Agent, or Firm* — Oblon, McClelland, Maier & Neustadt, L.L.P.

(57) ABSTRACT

A method of operating a protection device arranged between an electrical three-phase power source and at least one electric motor, the method including for each phase of the power source, acquiring over time a corresponding phase current flowing from the power source to the at least one electric motor; based on the acquired phase currents, detecting in which current stage each electric motor is, among an initial stage, an intermediate stage successive to the initial stage and a steady-state stage successive to the intermediate stage; calculating an active threshold value depending on the detected stage of each electric motor, the active threshold value during the intermediate stage following a predetermined decreasing function over time.

11 Claims, 5 Drawing Sheets

(51) Int. Cl.
*H02H 3/08* (2006.01)
*H02H 3/093* (2006.01)
*H02H 7/08* (2006.01)
*G01R 31/34* (2006.01)

(52) U.S. Cl.
CPC ........ *H02H 3/0935* (2013.01); *H02H 7/0816* (2013.01); *G01R 31/343* (2013.01)

(58) Field of Classification Search
CPC ....... B60K 6/40; B60K 6/448; E05F 15/1669; E05F 15/1684; E05F 15/208
USPC ....... 318/49, 50, 62, 98, 101, 102, 112, 432, 318/434
See application file for complete search history.

(56) References Cited

U.S. PATENT DOCUMENTS

| | | | | |
|---|---|---|---|---|
| 3,757,179 | A | * | 9/1973 | Pedersen .................... H02P 1/52 318/101 |
| 5,352,965 | A | * | 10/1994 | Kawabata ............... B66C 13/22 212/285 |
| 7,675,720 | B1 | * | 3/2010 | Zocholl ................ H02H 7/0816 318/445 |
| 8,279,565 | B2 | * | 10/2012 | Hall ..................... H02H 7/0816 318/432 |
| 2011/0241590 | A1 | * | 10/2011 | Horikoshi ............ H02H 7/0838 318/490 |

* cited by examiner

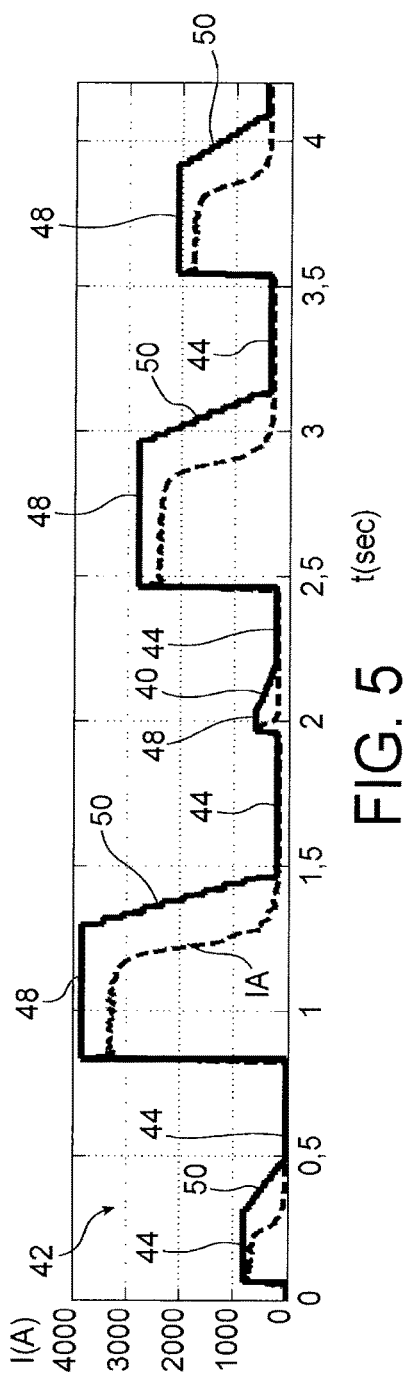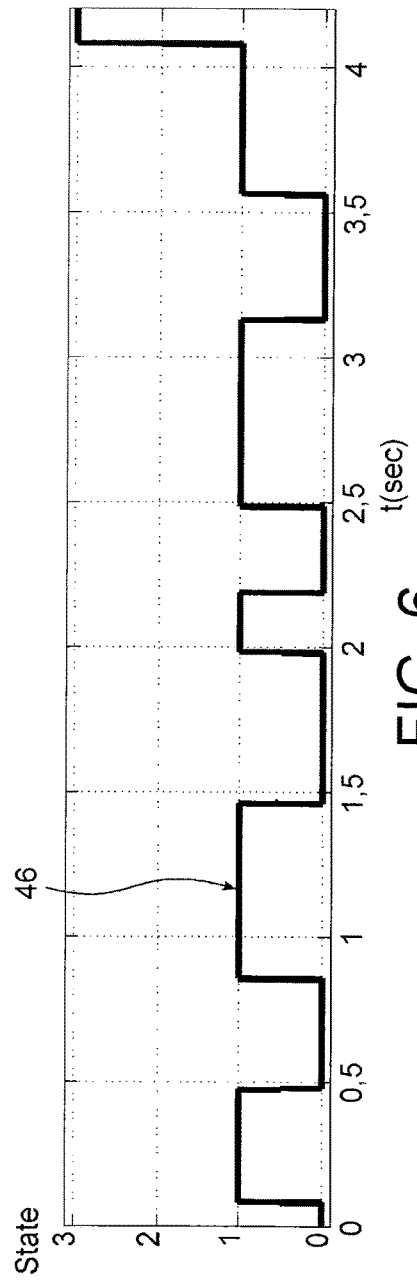

METHOD OF OPERATING A PROTECTION DEVICE, ASSOCIATED COMPUTER PROGRAM PRODUCT, PROTECTION DEVICE AND ELECTRICAL INSTALLATION

TECHNICAL FIELD

The invention concerns a method of operating a protection device arranged between an electrical three-phase power source and at least one electric motor. The invention also concerns a computer program product. The invention also concerns a protection device. The invention also concerns an electrical installation.

The invention applies to overcurrent circuit protection.

BACKGROUND ART

Electrical installations include electrical power sources and electrical loads, such as electric motors. Such electric motors are, for instance, medium voltage or low voltage electric motors, which typically means motors operating up to around 20 kV. Loads other than electrical motors can also be connected to the power sources.

Such electrical installations are generally provided with control circuitry. Such control circuitry generally includes a protection device for disconnecting the electric motors from the power source based on the current drawn by the electric motor. Generally, the protection device is configured to interrupt the current feeding the electric motor when the value of the current exceeds a predetermined threshold.

During the startup of the electric motors, and before reaching steady-state, the electrical current drawn by such electric motors is generally higher than their nominal current. Therefore, during the startup of the electric motor, the threshold is generally set to several times the nominal current to prevent the protection device from disconnecting the electric motor. Then, the current drawn by the electric motor decreases over time until it reaches the nominal current of the electric motor when the electric motor reaches steady-state. For instance, the predetermined threshold is then lowered to a value that is slightly higher than the nominal current of the electric motor. This method is known as "cold load pick-up".

When several electric motors are provided in the electrical circuit, for instance when several electric motors are connected through a power bus (also called feeder) to a same electric power supply or power source, the electric motors are generally started in a sequence in order to avoid voltage dips that may damage the power supply. Electric motors can also be started in a sequence due to industrial process purposes.

In such cases, the threshold is generally set to several times the sum of the nominal currents of the electric motors. Then, the threshold is lowered when all the electric motors are assumed to be in steady-state. Alternatively, the threshold is generally raised during the startup of each electric motor of the sequence, following a staircase pattern.

The documents U.S. Pat. Nos. 3,129,358 and 8,279,565 disclose such methods.

However, with such methods, if a fault occurs during the startup sequence, the fault is generally not detected until the end of the startup sequence, as the fault current is generally smaller than the threshold.

Therefore, these methods entail a risk of blindness if a fault occurs during the startup sequence, that is to say that the fault is generally not detected before the end of the startup sequence. Therefore, these methods lead to a lack of reactivity of the protection device.

The purpose of the invention is to propose a method for operating a protection device that allows for a better detection of faults, especially during the startup of cold loads such as electric motors.

SUMMARY OF INVENTION

To this end, the present invention concerns a method of the aforementioned type, the method comprising the steps of:

for each phase of the power source, acquiring over time a corresponding phase current flowing from the power source to the at least one electric motor;

based on the acquired phase currents, detecting in which current stage each electric motor is, among an initial stage, an intermediate stage successive to the initial stage and a steady-state stage successive to the intermediate stage;

calculating an active threshold value depending on the detected stage of each electric motor, the active threshold value during the intermediate stage following a predetermined decreasing function over time.

Indeed, such a method allows for a better detection of electrical faults during electric motor start-up through monitoring the pattern of the current waveform, even if the electric motors connected to the power source display different electrical characteristics (nominal current, for instance), for instance by setting the decreasing function to a function that follows the theoretical decrease of the electrical current from a peak value at startup to the nominal current. Such a method allows for a better detection of faults, a reduced risk of blinding, and therefore for a better reactivity if a fault occurs during the startup of an electric motor.

The invention also relates to a method such as defined above, wherein:

the protection device comprises a controllable switch configured to disconnect the at least one electric motor from the power source, the method further comprising the step of sending a control signal to the switch to disconnect the at least one electric motor from the power source if at least one phase current is larger than the active threshold value;

the method further comprises the steps of:

for the at least one electric motor, reading a corresponding nominal current and a corresponding starting current stored in a memory;

applying a predetermined transformation to the acquired phase currents to obtain a positive sequence component, a negative sequence component and a zero sequence component; and the step of detecting comprises detecting that the at least one electric motor is in the initial stage if:

during a first predetermined time interval, the positive sequence component displays a change in value that is higher than the starting current; and after the first predetermined time interval, the positive sequence component displays a value that is larger than an offset current value; and after the first predetermined time interval, each phase current displays a value that is larger than the offset current value; and during a second predetermined time interval, the negative sequence component displays a transient increase in value, the negative sequence component displaying a value that is larger than a predetermined fraction of the offset current value; and the positive sequence component is larger than the sum of the negative sequence component and of the zero sequence component;

at a given time, the offset current value is equal to the vector sum of the nominal currents of each electric motor in the steady-state stage at the given time and of a current that is representative of a power supply required by loads connected to the power source;

the active threshold value during the steady-state stage is equal to the result of multiplying the offset current value by a security coefficient, the security coefficient being larger than one;

the step of detecting comprises detecting that the at least one electric motor is in the intermediate stage if:
the previous stage is the initial stage; and
over a third predetermined time interval, the absolute value of the difference between the value of the positive sequence component at the beginning of the initial stage and the current value of the positive sequence component decreases;

the step of detecting comprises detecting that the at least one electric motor is in the steady-state stage if:
the previous stage is the intermediate stage; and
over a fourth predetermined time interval, the standard deviation of the positive sequence component relative to the initial value of the positive sequence component in the current stage is lower than a predetermined standard deviation;

the protection device comprises a controllable switch configured to disconnect the at least one electric motor from the power source, the method further comprising the step of sending a control signal to the switch to disconnect the at least one electric motor from the power source if:
the positive sequence component, respectively the negative sequence component, displays a value that is larger than a predetermined fraction of the positive sequence component, respectively the negative sequence component, acquired during a fifth predetermined time interval at the beginning of the starting stage; and
the positive sequence component is lower than the sum of the negative sequence component and of the zero sequence component;

the protection device comprises a controllable switch configured to disconnect the at least one electric motor from the power source, the method further comprising the step of sending a control signal to the switch to disconnect the at least one electric motor from the power source if:
the positive sequence component is lower than the sum of the negative sequence component and of the zero sequence component; and
each phase current is larger than the offset current value;

if the number of electric motors is larger than or equal to two, the electric motors are controlled to start sequentially according to a startup sequence.

The invention also relates to a computer program product comprising computer code instructions which, when executed by a computer, implement the method such as defined above.

The invention also relates to a protection device configured to be arranged between an electrical power source and at least one electric motor, characterized in that it comprises:

an acquisition module configured to acquire over time, for each phase of the power source, a corresponding phase current flowing from the power source to the at least one electric motor;

a calculator configured to detect in which current stage the at least one electric motor is among an initial stage, an intermediate stage successive to the initial stage and a steady-state stage successive to the intermediate stage, based on the acquired phase currents, the calculator being further configured to calculate an active threshold value depending on the detected stage of the at least one electric motor, the active threshold value during the intermediate stage following a predetermined decreasing function over time.

The invention also relates to an electrical installation comprising at least one electric motor and an electrical power source configured to provide electrical power to the at least one electric motor, the electrical installation further comprising a protection device such as defined above arranged between the electrical power source and at least one electric motor.

BRIEF DESCRIPTION OF DRAWINGS

The invention will be better understood by reference to the attached drawings, in which:

FIG. 5 is a graph showing the evolution over time of the supply current of several electric motors of the electrical installation of FIG. 1, and the corresponding active threshold value calculated by the protection device of FIG. 3, when no fault occurs;

FIG. 6 is a graph showing the evolution over time of a monitoring signal delivered by the protection device of FIG. 3, corresponding to the case of FIG. 5;

MODES FOR CARRYING OUT THE INVENTION

Figure 1:
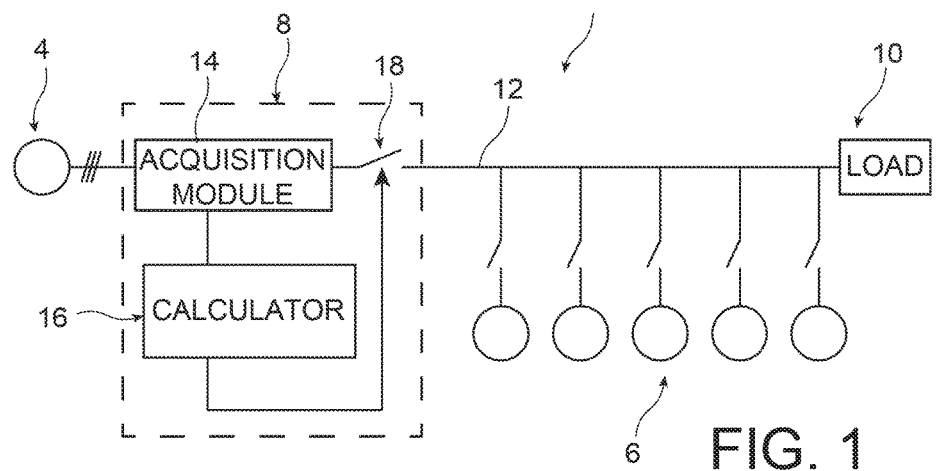
FIG. 1 is a schematic view of an electrical installation according to the invention.

An electrical installation 2 according to the invention is shown on FIG. 1.

The electrical installation 2 comprises an electrical power source 4 and at least one electric motor 6. In the example of FIG. 1, the electrical installation 2 comprises five electric motors 6. For instance, the electric installation 2 also comprises additional loads other than motors. For example, in the embodiment shown on FIG. 1, the electric installation 2 comprises one additional electrical load 10.

The electrical installation 2 further comprises a protection device 8.

The power source 4 is configured to provide electrical power to the electric motors 6 and to the electrical load 10.

The power source 4 is a three-phase power source.

Each electric motor 6 is connected to the power source 4 through a bus 12, the bus 12 comprising a plurality of cables, each cable being able to deliver a phase current corresponding to a phase of the power source 4. Preferably, the electric motors 6 share the same bus 12. Furthermore, each electrical load 10 is connected to the power source 4 through the bus 12.

For instance, the electric motors 6 are medium voltage electric motors. Alternatively, the electric motors 6 are low voltage electric motors.

When an electric motor 6 is not in an off-state, during normal operation, the electric motor 6 is either in an initial stage, in an intermediate stage or in a steady-state stage. The initial stage is the first stage during the startup of the electric motor 6. The following stage is the intermediate stage. Finally, the steady-state stage follows the intermediate stage.

Figure 2:
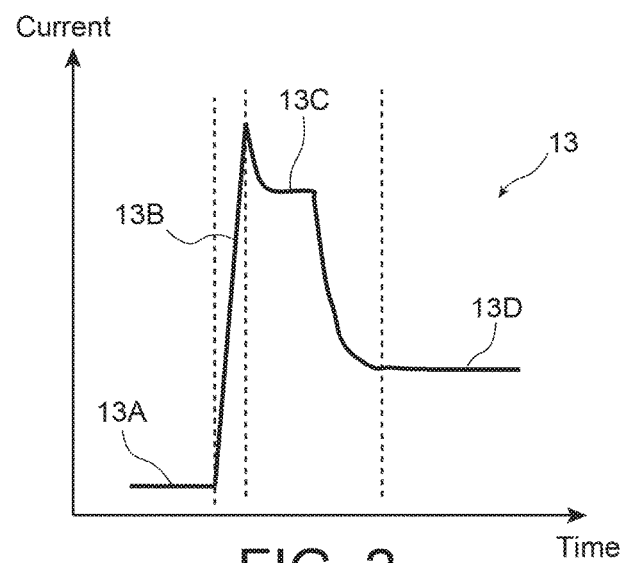
FIG. 2 is a simplified graph showing the evolution over time of the supply current of an electric motor of the electrical installation of FIG. 1.

The electrical current drawn by each electric motor 6 depends on the stage in which the electric motor 6 is. As shown on FIG. 2, when the electric motor 6 is off, the electrical current 13 drawn by the electric motor 6 is equal to zero. This corresponds to the first flat section 13A of the curve 13.

Then, when the electric motor 6 is switched on, the electric motor 6 goes into the initial stage. During the initial stage, the current drawn by the electric motor 6 increases rapidly to a value equal to a starting current of the electric motor 6. This increase in current corresponds to the section 13B of the curve 13.

Then, during the intermediate stage, the electrical current drawn by the electric motor 6 decreases from the starting current of the electric motor 6 to a steady-state current of the electric motor 6, the steady-state current also being also called "nominal current". This corresponds to the section 13C of the curve 13.

Finally, during the steady-state stage, the electric motor 6 draws a constant current equal to the nominal current of the electric motor 6. This corresponds to the section 13D of the curve 13.

If a fault occurs during the startup of an electric motor 6, the electrical current drawn by the electric motor does not generally comply with the aforementioned ideal case. For instance, after a fault, the electrical current drawn by the electric motor 6 is higher than the nominal current, even several seconds after startup.

Advantageously, the electric motors 6 are controlled to start in a sequence, according to a startup sequence.

As shown on FIG. 1, the protection device 8 is arranged on the bus 12 between the power source 4 and the electric motors 6. The protection device 8 is also arranged between the power source 4 and the electrical load 10.

The protection device 8 is configured to detect the occurrence of faults in the electric installation 2. Moreover, the protection device 8 is configured to disconnect the electric motors 6 from the power supply 4 upon detection of a fault.

Figure 3:
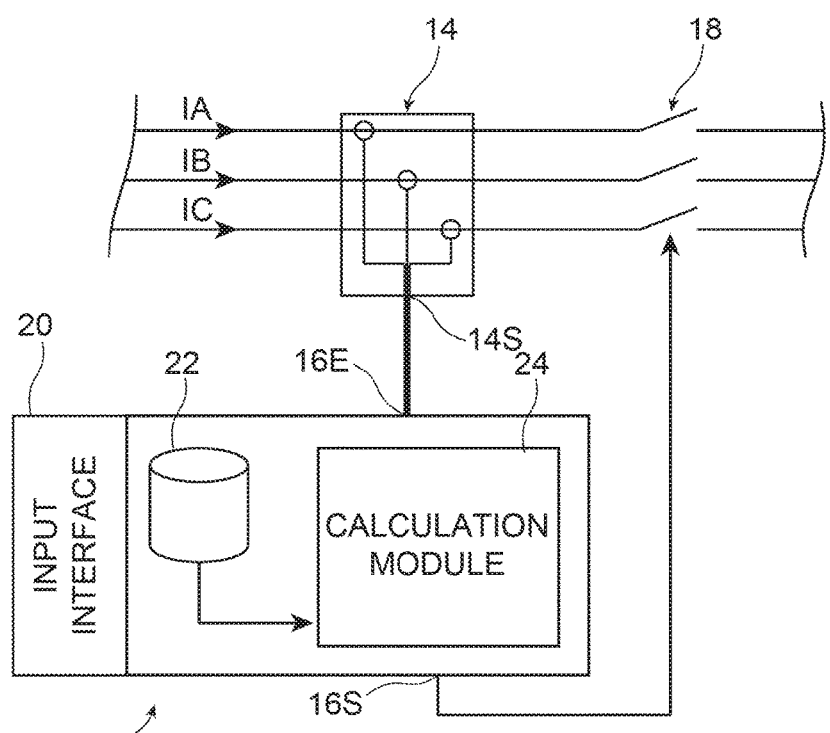
FIG. 3 is a schematic view of the protection device of the electrical installation of FIG. 1.

Turning to FIG. 3, the protection device 8 comprises an acquisition module 14, a calculator 16 and a controllable switch 18.

The acquisition module 14 is connected to the bus 12. More precisely, the acquisition module 14 is arranged on the bus 12.

An output 14S of the acquisition module 14 is connected to an input 16E of the calculator 16 and an output 16S of the calculator 16 is connected to the switch 18.

The switch 18 is arranged on the bus 12 so that the switch 18 is controllable to stop or allow flowing of electrical current in the bus 12.

The acquisition module 14 is configured to acquire, over time, a phase current IA, IB, IC corresponding to each phase of the power source 4 and flowing from the power source 4 to the electric motors 6.

The acquisition module 14 is also configured to transmit the acquired phase currents IA, IB, IC to the calculator 16, through the output 14S.

The calculator 16 is configured to receive the acquired phase currents IA, IB, IC from the acquisition module 14, through the input 16E.

The calculator 16 is configured to detect in which stage each electric motor 6 is among the initial stage, the intermediate stage and the steady-state stage, based on the acquired phase currents IA, IB, IC.

The calculator 16 is also configured to deliver a monitoring signal. Advantageously, the monitoring signal is used for controlling the switch 18 through the output 16S.

The calculator 16 is further configured to calculate an active threshold value depending on the detected stage of each electric motor 6.

As shown on FIG. 3, the calculator 16 comprises an input interface 20, a memory 22 and a calculation module 24.

The input interface 20 is configured to allow a user to input data regarding the electric motors 6. Such data comprises the nominal current of each electric motor 6, the number of electric motors 6 of the startup sequence and the rank of each electric motor 6 in the startup sequence. For instance, such data further comprises the starting current of each electric motor 6 and the power factor of each electric motor 6. Optionally, data inputted by the user through the input interface 20 further comprises the nominal current of each electrical load 10 and the power factor of each electrical load 10.

The memory 22 is configured to store data inputted by the user through the input interface 20.

Figure 7:
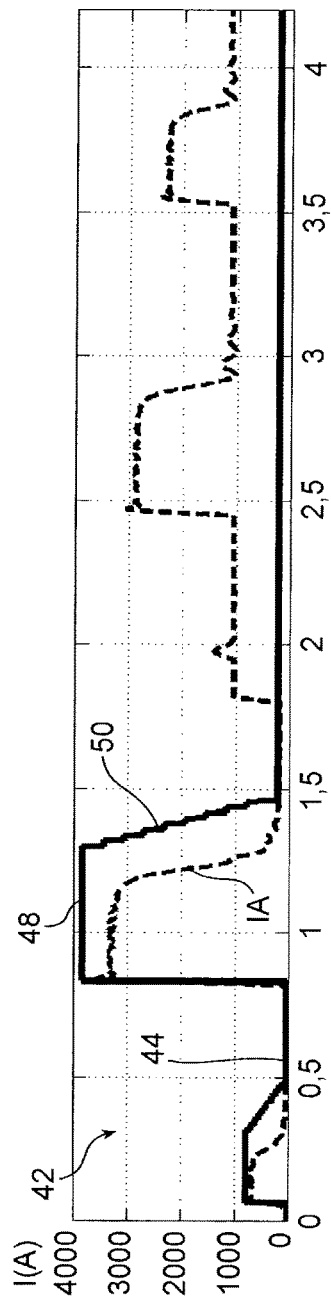
FIG. 7 is a graph showing the evolution over time of the supply current of several electric motors of the electrical installation of FIG. 1, and the corresponding active threshold value calculated by the protection device of FIG. 3, when a fault occurs.

The calculation module 24 is configured to process the acquired phase currents IA, IB, IC to calculate an active threshold value 42, shown on FIGS. 5 and 7. The calculation module 24 is also configured to apply a predetermined transformation to the acquired phase currents IA, IB, IC to obtain a set of symmetrical components comprising a positive sequence component I1, a negative sequence component I2 and a zero sequence component I0. Such a transformation is known; for instance, such a transformation is the transformation proposed by Fortescue.

Optionally, the calculation module 24 is also configured to use the power factors of the electric motors 6 to calculate the active threshold value. For instance, the calculation module 24 is configured to use the power factors of the electric motors 6 to compute the active threshold value during the starting sequence.

The calculation module 24 is also configured to detect, using the acquired phase currents IA, IB, IC and the symmetrical components I0, I1, I2, in which stage each electric motor 6 is, among the initial stage, the intermediate stage and the steady-state stage.

The calculation module 24 is also configured to deliver the monitoring signal.

For instance, as shown on FIG. 6, the monitoring signal is a four-state signal: state "0" indicates that the calculator 16 waits for the startup of a motor (the installation being in a state called "IDLE" or "Stand-by state"), state "1" indicates that the startup of an electric motor 6 is detected, state "2" indicates that a fault has been detected, and state "3" indicates that the startup sequence is completed.

Advantageously, the switch 18 disconnects the bus 12 of the electric motors 6 and the load 10 from the power source 4 when the monitoring signal is in state "2".

Advantageously, the monitoring signal is further meant to be used as an alert signal.

Figure 4:
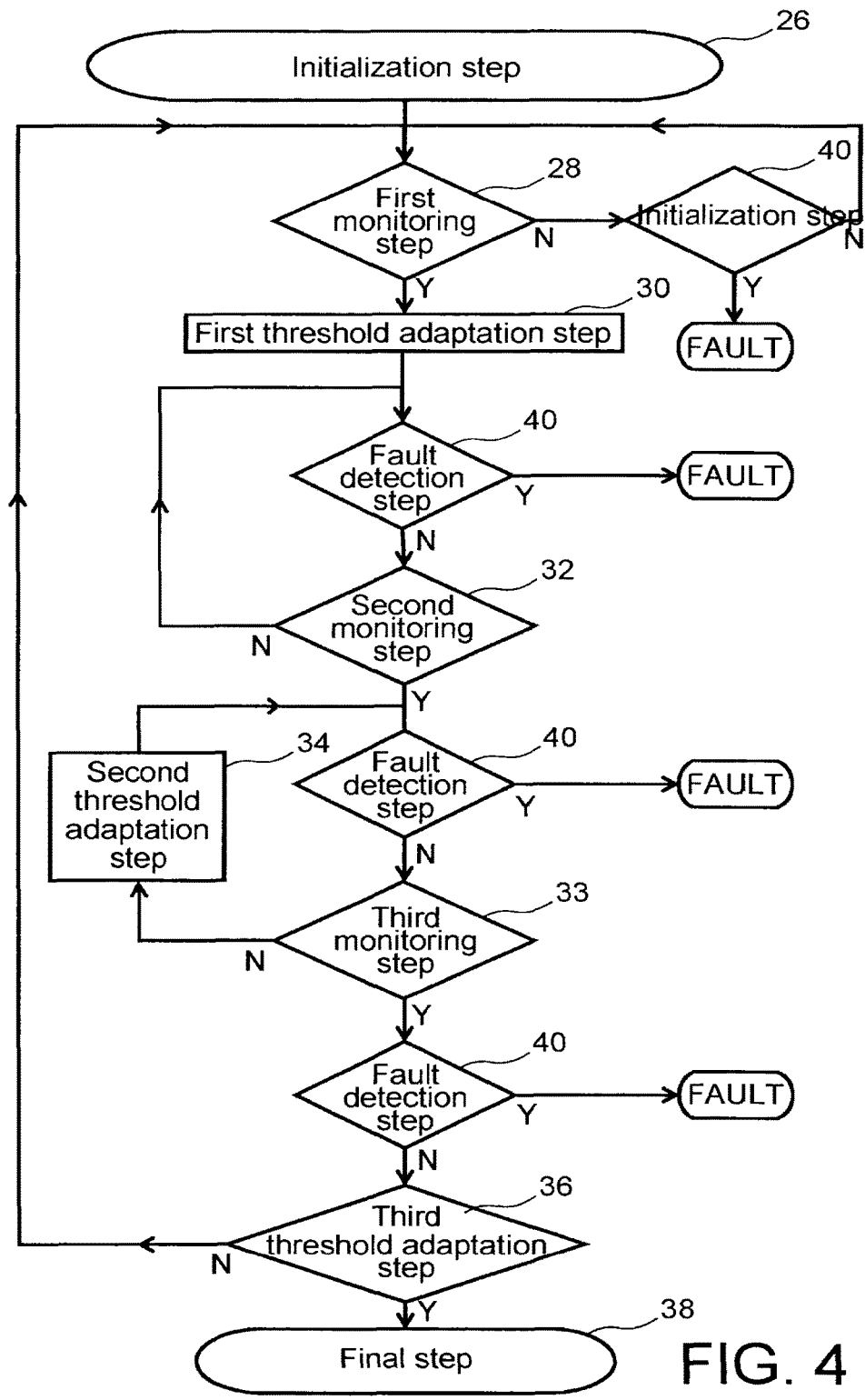
FIG. 4 is a flowchart representing the operation of the protection device of FIG. 3.

The operation of the protection device 8 will now be described with reference to FIGS. 4, 5 and 6.

During an initialization step 26, a user inputs the number of electric motors 6 of the startup sequence.

The user also inputs, for each electric motor 6 of the electrical installation 2, the corresponding nominal current and the corresponding rank in the startup sequence. In a preferred embodiment, the user also inputs the starting current and the power factor for each motor 6.

The user further inputs, the nominal current and the power factor of each electrical load 10 of the electric installation 2. Advantageously, the user also inputs the operating frequency of the power source 4.

The protection device 8 stores the data inputted by the user in the memory 22.

During the steps following the initialization step 26, the protection device 8 acquires, over time, for each phase of the power source 4, the corresponding phase current IA, IB, IC flowing from the power source 4 to the electric motors 6.

The protection device 8 also identifies the electric motors that have already been successfully switched on, also called "started motors". Each started motor is in the steady-state stage.

The protection device 8 also identifies the next electric motor in the starting sequence that has not yet reached the steady-state stage, also called "monitored motor".

The protection device 8 also calculates the symmetrical components I0, I1, I2, using the acquired phase currents IA, IB, IC.

Then, during a first monitoring step 28, the protection device 8 monitors the phase currents IA, IB, IC and the symmetrical components I0, I1, I2 to detect if the monitored motor has reached the initial stage.

The first monitoring step 28 is, for example, triggered by the change of position of a main line switch. Alternatively, the first monitoring step 28 is triggered if the electrical current in the bus 12 exceeds a predetermined limit. For instance, the predetermined limit is set to the sum of an offset current value and a low current value, such as 0.1 A.

The offset current value is equal to the vector sum of the nominal currents of the started motors and the nominal currents of the additional loads 10 connected to the power source 4, if any.

During the first monitoring step 28, the active threshold value 42 is set to the result of multiplying, by a security coefficient, the vector sum of the offset current value and a starting current of the monitored motor.

For instance, the starting current of each electric motor 6 is known. Alternatively, the starting current of an electric motor 6 is set to the result of multiplying the nominal current of the motor by a starting coefficient. Preferably, the starting coefficient is set by the user during the initialization step 26. For instance, the starting coefficient has a value between 6 and 8, for example equal to 7.

For instance, the security coefficient is set by the user during the initialization step 26. The security coefficient is preferably slightly larger than one, for instance equal to 1.1, which means a security coefficient of 110%.

Therefore, as shown on FIG. 5, the active threshold value 42 displays a level 44 during the first monitoring step 28. Also, as shown on FIG. 6, the monitoring signal 46 is in state "0".

If, during the first monitoring step 28, the protection device 8 detects that:
during a first predetermined time interval, the positive sequence component I1 displays a change in value that is higher than the starting current of the monitored motor; and
during the first predetermined time interval, the positive sequence component I1 displays a value that is larger than the offset current value; and
during the first predetermined time interval, each phase current IA, IB, IC displays a value that is larger than the offset current value; and
after the first predetermined time interval and during a second predetermined time interval, the negative sequence component I2 displays a transient increase in value, the negative sequence component I2 displaying a value that is larger than a predetermined fraction of the offset current value; and
the positive sequence component I1 is larger (for instance two times larger) than the sum of the negative sequence component I2 and of the zero sequence component I0;
then the protection device 8 detects that the monitored motor has been started up and is in the initial stage.

For instance, the first predetermined time interval is equal to 10 ms for a power source 4 operating at 50 Hz.

For instance, the second predetermined time interval is the inverse of the operating frequency of the power source 4. For example, the second predetermined time interval is equal to 20 ms for a power source 4 operating at 50 Hz.

For instance, the predetermined fraction of the offset current value is equal to 5% of the offset current value.

If, during the first monitoring step 28, the protection device 8 detects that the monitored motor is in the initial stage, then, during a first threshold adaptation step 30, the protection device 8 sets the active threshold value 42 to the result of multiplying, by a second predetermined coefficient, the vector sum of the offset current value and the starting current of the monitored motor. For instance, the second predetermined coefficient is equal to the security coefficient, as defined above.

Then, during a second monitoring step 32, the protection device 8 monitors the phase currents IA, IB, IC and the symmetrical components I0, I1, I2 to detect if the monitored motor has reached the intermediate stage.

As shown on FIG. 5, during the second monitoring step 32, the active threshold value 42 displays a level 48 that is higher than the level 44 of the first monitoring step 28. The difference between the level 48 of the second monitoring step 32 and the level 44 of the first monitoring step 28 is higher than or equal to the starting current of the monitored motor.

Also, as shown on FIG. 6, during the second monitoring step 32, the monitoring signal 46 is in state "1".

If, during the second monitoring step 32, the protection device 8 detects that, over a third predetermined time interval, the absolute value of the difference between the value of the positive sequence component I1 at the beginning of the initial stage and the current value of the positive sequence component I1 decreases, then the protection device 8 detects that the monitored motor is in the intermediate stage.

For instance, the third predetermined time interval is equal to 10 ms for a power source 4 operating at 50 Hz.

If, during the second monitoring step 32, the protection device 8 detects that the monitored motor is in the intermediate stage, then, during a third monitoring step 33, the protection device 8 monitors the phase currents IA, IB, IC and the symmetrical components I0, I1, I2 to detect if the monitored motor has reached the steady-state stage, as described below.

While the monitored motor has not yet reached the steady-state stage, the protection device 8 lowers the active threshold value during a second threshold adaptation step 34.

More precisely, while the monitored motor has not yet reached steady-state stage, the protection device 8 lowers the active threshold value by a predetermined amount. For instance, for a power source 4 operating at 50 Hz, the active threshold value is lowered every 20 ms by 10% of the greatest value between the starting current of the monitored motor and the offset current value.

So, during the second threshold adaptation step 34, the active threshold value 42 follows a decreasing function, as shown on the portions of FIG. 5.

During the second threshold adaptation step 34, the monitoring signal 46 is also in state "1", as shown on FIG. 6.

At the same time, the protection device 8 monitors the phase currents IA, IB, IC and the symmetrical components I0, I1, I2 to detect if the monitored motor has reached the steady-state stage, according to the third monitoring step 33.

If, during the third monitoring step 33, the protection device 8 detects that, over a fourth predetermined time interval, the standard deviation of the positive sequence component I1 relative to the initial value of the positive sequence component I1 in the current stage is lower than a predetermined standard deviation, then the protection device 8 detects that the monitored motor is in the steady-state stage and has successfully started. The monitored motor becomes part of the started motors.

For instance, the fourth predetermined time interval is equal to 10 ms for a power source 4 operating at 50 Hz.

For instance, the predetermined standard deviation is equal to 1%.

Then, during a third threshold adaptation step 36, the protection device 8 sets the active threshold value to the result of multiplying the offset current value by a third predetermined coefficient, the offset current value taking into account the nominal current of the last monitored motor. For instance, the third predetermined coefficient is equal to the security coefficient, as defined above.

If the previous monitored motor was the last electric motor 6 of the startup sequence, then, during a final step 38, the protection device 8 locks the value of the active threshold value. As shown on FIG. 6, during the final step 38, the monitoring signal 46 is set to state "3".

If the previous monitored motor was not the last electric motor 6 of the startup sequence, then the protection device 8 assigns the status of "monitored motor" to the following electric motor 6 in the startup sequence. Moreover, the protection device 8 monitors the phase currents IA, IB, IC and the symmetrical components I0, I1, I2 to detect if the new monitored motor has reached the initial stage, according to the first monitoring step 28.

Figure 8:
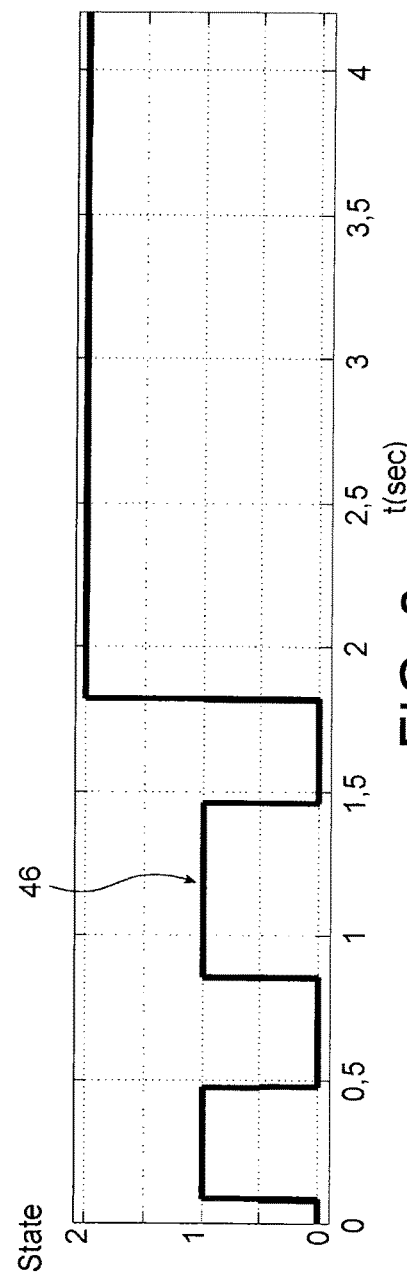
FIG. 8 is a graph showing the evolution over time of a monitoring signal delivered by the protection device of FIG. 3, corresponding to the case of FIG. 7.

If, during the operation of the protection device 8, at least one phase current IA, IB, IC is larger than the active threshold value, then the calculator 16 sets the monitoring signal to state "2", as shown on FIG. 8. Therefore, the switch 18 disconnects the electric motors 6 from the power source 4.

Preferably, as the calculator 16 introduces some delay between the acquisition of the currents and the calculation of the active threshold value, in order to avoid unnecessary tripping, the calculator 16 sends a control signal to the switch 18 if a delayed version of the acquired phase currents IA, IB, IC is larger than the active threshold value. The delay is, for instance, set by the user. Such a delay is, for instance, equal to 20 ms for a power source operating at 50 Hz.

Moreover, a fault detection step 40 is carried out during and after each step 28, 30, 32, 33, 34, 36.

If the protection device 8 detects a fault during the fault detection step, the calculator 16 sets the monitoring signal to state "2", as shown on FIG. 8. Therefore, the switch 18 disconnects the electric motors 6 from the power source 4.

The protection device 8 detects a fault if:
the positive sequence component I1, respectively the negative sequence component I2, displays a value that is larger than a predetermined fraction (for instance 30%) of the positive sequence component I1, respectively the negative sequence component I2, acquired during a fifth predetermined time interval at the beginning of the starting stage; and
the positive sequence component I1 is lower (for instance two times lower) than the sum of the negative sequence component I2 and of the zero sequence component I0.

The protection device 8 also detects a fault if:
the positive sequence component I1 is lower (for instance two times lower) than the sum of the negative sequence component I2 and of the zero sequence component I0; and
each phase current I1, I2, I3 is larger than the offset current value.

For instance, the fifth predetermined time interval is equal to 10 ms for a power source 4 operating at 50 Hz.

In another embodiment, the user does not provide a startup sequence. In this case, the protection device 8 is also configured to detect which electric motor 6 is currently starting, by comparing the increase in current during the first monitoring step 28 to the starting current of each electric motor 6 that has not started yet.

In another embodiment, all the electric motors 6 are identical. In this case, the user does not need to provide a startup sequence during the initialization step 26.

The invention claimed is:

1. A method of operating a protection device arranged between an electrical three-phase power source and at least one electric motor, the method comprising:
for each of the three phases of the power source, acquiring over time a corresponding phase current flowing from the power source to the at least one electric motor;
based on the acquired phase currents of the three phases, detecting a current stage of each of the at least one electric motor, among an off stage, an initial stage successive to the off stage, an intermediate stage successive to the initial stage and a steady-state stage successive to the intermediate stage; and
calculating an active threshold value depending on the detected stage of each of the at least one electric motor, the active threshold value during the intermediate stage varying according to a predetermined decreasing function over time,
wherein the method further includes
for the at least one electric motor, reading a corresponding nominal current and a corresponding starting current stored in a memory;

applying a predetermined transformation to the acquired phase currents to obtain a positive sequence component, a negative sequence component and a zero sequence component; and wherein the detecting comprises detecting that the at least one electric motor is in the initial stage if:

during a first predetermined time interval, the positive sequence component displays a change in value that is higher than the starting current; and after the first predetermined time interval, the positive sequence component displays a value that is larger than an offset current value; and after the first predetermined time interval, each phase current displays a value that is larger than the offset current value; and during a second predetermined time interval, the negative sequence component displays a transient increase in value, the negative sequence component displaying a value that is larger than a predetermined fraction of the offset current value; and the positive sequence component is larger than the sum of the negative sequence component and of the zero sequence component.

2. The method according to claim 1, wherein the protection device comprises a controllable switch configured to disconnect the at least one electric motor from the power source, the method further comprising the sending a control signal to the switch to disconnect the at least one electric motor from the power source if at least one phase current is larger than the active threshold value.

3. The method according to claim 1, wherein, at a given time, the offset current value is equal to the vector sum of the nominal currents of each of the at least one electric motor in the steady-state stage at the given time and of a current that is representative of a power supply required by loads connected to the power source.

4. The method according to claim 3, wherein the active threshold value during the steady-state stage is equal to the result of multiplying the offset current value by a security coefficient, the security coefficient being larger than one.

5. The method according to claim 1, wherein the detecting comprises detecting that the at least one electric motor is in the intermediate stage if:

the previous stage is the initial stage; and over a third predetermined time interval, the absolute value of the difference between the value of the positive sequence component at the beginning of the initial stage and the current value of the positive sequence component decreases.

6. The method according to claim 1, wherein the detecting comprises detecting that the at least one electric motor is in the steady-state stage if:

the previous stage is the intermediate stage; and over a fourth predetermined time interval, the standard deviation of the positive sequence component relative to the initial value of the positive sequence component in the current stage is lower than a predetermined standard deviation.

7. The method according to claim 1, wherein the protection device comprises a controllable switch configured to disconnect the at least one electric motor from the power source, the method further comprising sending a control signal to the switch to disconnect the at least one electric motor from the power source if:

the positive sequence component, respectively the negative sequence component, displays a value that is larger than a predetermined fraction of the positive sequence component, respectively the negative sequence component, acquired during a fifth predetermined time interval at the beginning of the starting stage; and the positive sequence component is lower than the sum of the negative sequence component and of the zero sequence component.

8. The method according to claim 1, wherein the protection device comprises a controllable switch configured to disconnect the at least one electric motor from the power source, the method further comprising sending a control signal to the switch to disconnect the at least one electric motor from the power source if:

the positive sequence component is lower than the sum of the negative sequence component and of the zero sequence component; and each phase current is larger than the offset current value.

9. The method according to claim 1, wherein, if a number of electric motors is larger than or equal to two, the electric motors are controlled to start sequentially according to a startup sequence.

10. A non-transitory computer-readable medium encoded with computer-readable instructions that, when executed by a calculator circuit, cause the calculator circuit to perform a method comprising:

for each phase of a three-phase power source, acquiring over time a corresponding phase current flowing from the power source to at least one electric motor;

based on the acquired phase currents of the three-phase power source, detecting a current stage of each of the at least one electric motor, among an off stage, an initial stage successive to the off stage, an intermediate stage successive to the initial stage and a steady-state stage successive to the intermediate stage; and calculating an active threshold value depending on the detected stage of each of the at least one electric motor, the active threshold value during the intermediate stage varying according to a predetermined decreasing function over time, wherein the method further includes for the at least one electric motor, reading a corresponding nominal current and a corresponding starting current stored in a memory;

applying a predetermined transformation to the acquired phase currents to obtain a positive sequence component, a negative sequence component and a zero sequence component; and wherein the detecting comprises detecting that the at least one electric motor is in the initial stage if:

during a first predetermined time interval, the positive sequence component displays a change in value that is higher than the starting current; and after the first predetermined time interval, the positive sequence component displays a value that is larger than an offset current value; and after the first predetermined time interval, each phase current displays a value that is larger than the offset current value; and during a second predetermined time interval, the negative sequence component displays a transient increase in value, the negative sequence component displaying a value that is larger than a predetermined fraction of the offset current value; and the positive sequence component is larger than the sum of the negative sequence component and of the zero sequence component.

11. A protection device configured to be arranged between an electrical three-phase power source and at least one electric motor, comprising:

an acquisition module configured to acquire over time, for each phase of the three-phase power source, a corresponding phase current flowing from the power source to the at least one electric motor;

a calculator configured to detect a present stage of each of the at least one electric motor, the current stage being one of an off stage, an initial stage successive to the off stage, an intermediate stage successive to the initial stage and a steady-state stage successive to the intermediate stage, based on the acquired phase currents from the three-phase power source, the calculator being further configured to calculate an active threshold value depending on the detected stage of the at least one electric motor, the active threshold value during the intermediate stage varying according to a predetermined decreasing function over time, wherein the calculator is further configured to for the at least one electric motor, read a corresponding nominal current and a corresponding starting current stored in a memory, apply a predetermined transformation to the acquired phase currents to obtain a positive sequence component, a negative sequence component and a zero sequence component; and wherein the calculator is configured to detect that the at least one electric motor is in the initial stage if:

during a first predetermined time interval, the positive sequence component displays a change in value that is higher than the starting current, and after the first predetermined time interval, the positive sequence component displays a value that is larger than an offset current value; and after the first predetermined time interval, each phase current displays a value that is larger than the offset current value; and during a second predetermined time interval, the negative sequence component displays a transient increase in value, the negative sequence component displaying a value that is larger than a predetermined fraction of the offset current value; and the positive sequence component is larger than the sum of the negative sequence component and of the zero sequence component.

* * * * *